(12) United States Patent
Steckhan

(10) Patent No.: US 7,655,527 B2
(45) Date of Patent: Feb. 2, 2010

(54) SEMICONDUCTOR ELEMENT AND PROCESS OF MANUFACTURING SEMICONDUCTOR ELEMENT

(75) Inventor: Hans-Hinnerk Steckhan, Munich (DE)

(73) Assignee: Infineon Technologies Austria AG, Villach (AT)

( * ) Notice: Subject to any disclaimer, the term of this patent is extended or adjusted under 35 U.S.C. 154(b) by 407 days.

(21) Appl. No.: 11/557,387

(22) Filed: Nov. 7, 2006

(65) Prior Publication Data
US 2008/0105956 A1    May 8, 2008

(51) Int. Cl.
*H01L 21/331* (2006.01)
*H01L 21/8222* (2006.01)

(52) U.S. Cl. .................. 438/311; 438/197; 438/106; 438/123; 257/E21.32; 257/E21.229; 257/E21.499

(58) Field of Classification Search .......... 438/311, 438/197, 106, 111, 118, 122, 123, 124, 692
See application file for complete search history.

(56) References Cited

U.S. PATENT DOCUMENTS

| | | | |
|---|---|---|---|
| 5,808,358 A * | 9/1998 | Vinciarelli et al. ........ 257/700 |
| 6,104,083 A * | 8/2000 | Ito ........................ 257/666 |
| 6,320,270 B1 * | 11/2001 | Muto et al. ............. 257/787 |
| 6,392,308 B2 * | 5/2002 | Muto et al. ............. 257/787 |
| 6,492,739 B2 * | 12/2002 | Muto et al. ............. 257/787 |

* cited by examiner

*Primary Examiner*—David Nhu
(74) *Attorney, Agent, or Firm*—Schwegman Lundberg & Woessner, P.A.

(57) ABSTRACT

Shown are embodiments where a process of manufacturing a semiconductor element on a semiconductor wafer is shown. The semiconductor element is obtained by dividing the function-providing semiconductor wafer into functional elements. The function-providing semiconductor wafer is, at its first main surface, mechanically coupled to a handling wafer. The thinning is carried out in the coupled state of the function-providing semiconductor wafer, and the function-providing semiconductor wafer is divided in its state coupled to the handling wafer. During or after connecting the semiconductor element to a lead frame the mechanical coupling between the semiconductor element and the corresponding part of the handling wafer is destroyed. Other embodiments are also shown.

33 Claims, 2 Drawing Sheets

SEMICONDUCTOR ELEMENT AND PROCESS OF MANUFACTURING SEMICONDUCTOR ELEMENT

TECHNICAL FIELD

Various embodiments described herein relate to semiconductors generally, including manufacturing thin semiconductor elements, such as vertical MOS transistors.

BACKGROUND INFORMATION

The on-resistance $R_{on}$ of vertical MOS transistor elements is dependent on the length of the current path within the silicon substrate of the semiconductor element, i.e. on the thickness of the substrate (chip). Therefore, in the manufacturing of such semiconductor elements thinning of the silicon wafer is known as a means for reducing the resistance. Using conventional thinning processes, such as grinding, etching or CMP (Chemical-Mechanical-Polishing), thickness values down to about 50 μm can be achieved.

Tf thinning a semiconductor wafer to such low thickness, as well as subsequent acts, such as implantation steps or metallization steps, generally require provision of a suitable support system to handle the very thin and, therefore, highly bendable wafer, protecting it from damage in the course of the several handling steps. Conventional support systems rely on a certain, although not fully sufficient, degree of internal mechanical stability of the wafer. For this reason, among others, the presently achievable minimum thickness of thin semiconductor elements is limited.

DETAILED DESCRIPTION

Significant steps of a process according to an embodiment to the invention are explained in more detail on the basis of FIGS. 1A to 1J.

Figure 1A:
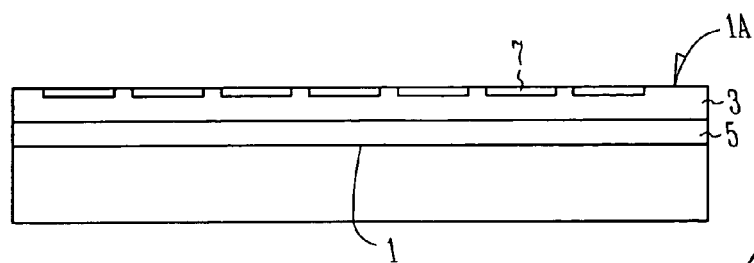
FIGS. 1A to 1I show significant steps of a process of manufacturing a semiconductor element according to an embodiment of the invention.

FIG. 1A shows an SOI wafer 1, as a function-providing wafer comprising an active layer 3 arranged over a buried oxide layer 5. In some embodiments, the active layer 3 may e.g. be about 5 μm thick. As schematically shown in the figure, in a first main surface 1a of the SOI wafer 1 a plurality of semiconductor element structures 7 has been formed. In some embodiments each structure represents a single semiconductor element. In some other embodiments, two or more structures represent a semiconductor element. In some embodiments the semiconductor elements are the source, gate and drain of a vertical MOS semiconductor.

According to a some embodiments of the invention, a semiconductor element is provided having a substrate thickness of 50 μm or below, specifically within the range of 2 μm to 20 μm, and more specifically in the range of 5 μm to 10 μm, and being made by a process as explained above. Herein, the term "substrate" is used to define the physically relevant, function-providing semiconductor material thickness of the remaining portion of the function-providing wafer.

In a some embodiments, the semiconductor element comprises the function of an MOSFET or an IGBT. Furthermore, the semiconductor element may comprise the function of a high-frequency power element.

In some embodiments the semiconductor element comprises a metallization layer on its backside, the metallization layer being connected to a lead frame via a solder layer. More specifically, the solder layer connecting the backside metallization to the lead frame comprises a solder material of a type which forms intermetallic phases by isothermal solidification.

Figure 1B:
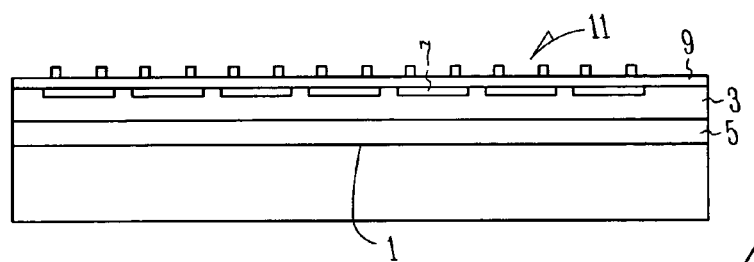
Figure 1C:
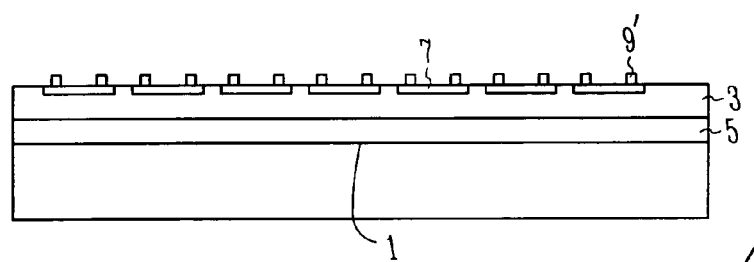

As shown in FIG. 1B, on the main surface 1a of the SOI wafer 1, a polyimide-based adhesive layer 9 is provided. Thereon, a patterned resist layer (mask) 11 is provided for patterning the adhesive layer 9. As shown in FIG. 1C, in the result of an etch step using the mask 11, and after removal of mask residues, a structured adhesive layer 9' remains on the main surface 1a of the SOI wafer 1, the adhesive layer structure consisting of adhesive anchor islands arranged in accordance with the semiconductor element structure 7 in the main surface 1a.

It should be noted that in the embodiment shown and explained here a patterned adhesive layer is provided on the first main surface of the SOI wafer. However, in some other embodiments, a solid adhesive layer may be provided.

Figure 1D:
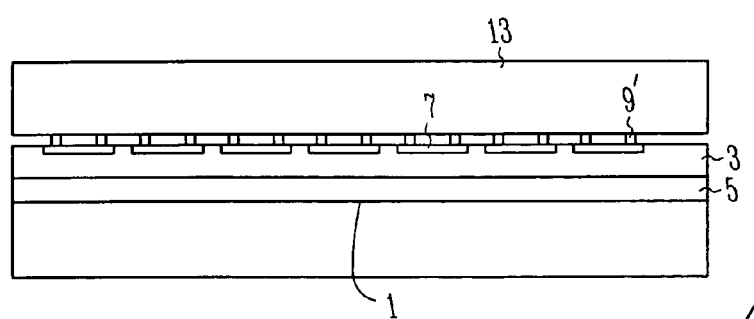
Figure 1E:
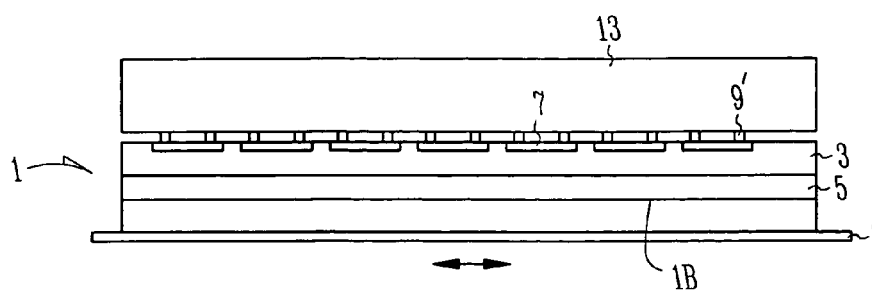
Figure 1F:
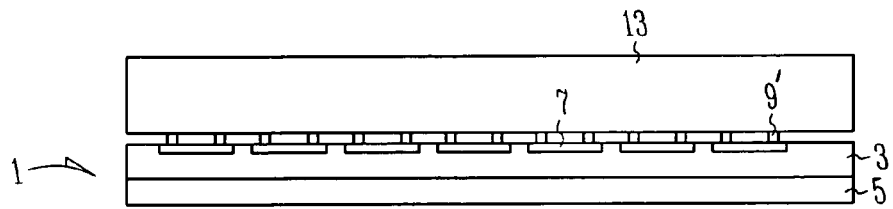

As shown in FIG. 1D, a handling wafer 13 is brought into contact with the patterned adhesive layer 9' such that, by means of the adhesive islands, the SOI wafer 1 is mechanically connected to the handling wafer 13. As schematically shown in FIG. 1E, a grinding tool T is applied to the second main surface 1b to provide a thinning of the "bulk" material of the SOI wafer 1. Subsequent to this first thinning step, a second thinning step is carried out as a selective etching step which stops at the lower surface of the buried oxide layer 5 in a self-controlled manner. The status of the SOI wafer/handling wafer arrangement resulting from this latter thinning step is shown in FIG. 1F. Thereafter, the oxide layer is removed and further processing steps may be carried out at the second, now exposed, main surface of the remaining function providing wafer—basically the original active layer 3—, e.g. implantation and/or metallization steps.

Figure 1G:
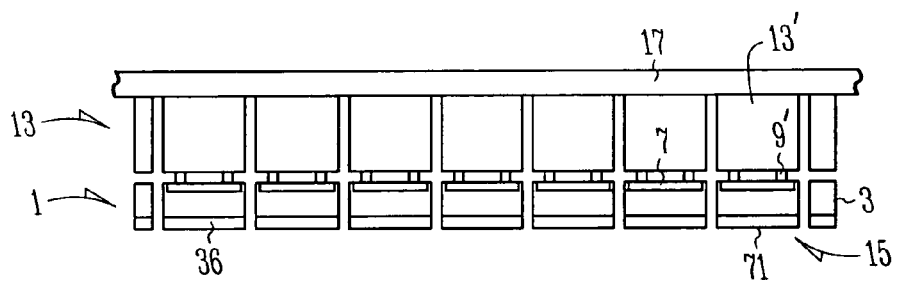

As shown in FIG. 1G only by way of example, in the result of such steps a backside metallization layer 15 is provided on the second main surface 3b of the function-providing wafer or function-providing layer 3, respectively. Thereafter, a dicing foil 17 is applied to the free surface of the handling wafer 13, and a dicing of the function-providing layer/handling wafer compound is carried out, providing separated semiconductor elements 7', still connected to corresponding parts 13' of the handling wafer and adhering to the dicing foil 17.

Figure 1H:
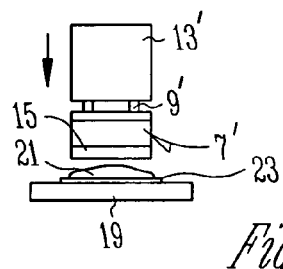
Figure 1I:
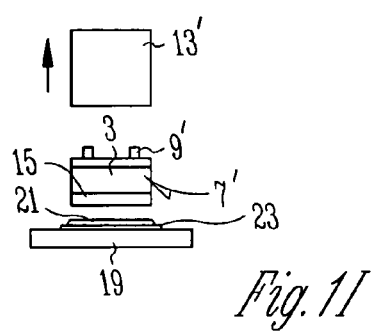

As schematically illustrated in FIG. 1H, the semiconductor element/handling wafer element compounds 7'/13' are positioned over a lead frame 19, to which a solder material 21, e.g. an AuSn solder, has been applied on a Au-plated bond pad 23. In some embodiments, by means of a suitable bond tool (not shown) the semiconductor element/handling wafer element compound 7'/13' is pressed into contact with the solder layer 21 at a predetermined temperature and for a predetermined time, to produce a die-bond connection between the lead frame 19 and the backside metallization 15 of the semiconductor element 7'. The temperature at this step is selected such that, at the same time, the polyimide-based adhesive of the patterned adhesive layer 9' softens or degenerates, respectively. In the result of an isothermal solidification of an intermetallic phase formed at the solder/metallization interphase 21/15, in combination with the weakening of the adhesive connection between the semiconductor element 7' and the corresponding part 13' of the handling wafer, the latter may be removed from the semiconductor element, whereas the semiconductor element is tightly bonded to the lead frame, as illustrated in FIG. 1I.

Providing a bond tool which is adapted to grip the handling wafer element 13' and to move it away from the semiconductor element/lead frame compound 7'/19 when, at the same time, holding the latter in place, facilitates to carry out this last-mentioned step. Further steps for removing the remainders of the adhesive layer 9', as well as further cleaning and wire bonding steps for external electrical connection of the semiconductor element will follow.

Embodiments of the present invention provide for a high-yield and cost-efficient process of manufacturing a semiconductor element of the above mentioned type. Embodiments of the invention provide for a semiconductor element and a process of manufacturing same wherein a very low substrate thickness and, therefore, very low on-resistance and power consumption may be achieved.

In an embodiment of the invention, the process is based on a semiconductor wafer with a first main surface, in which a plurality of semiconductor elements has been formed, and a second main surface which is defined by thinning steps, wherein the semiconductor element is obtained by dividing the function-providing semiconductor wafer into functional elements or units, respectively, and wherein the semiconductor element is mechanically and electrically connected to a lead frame. The function-providing semiconductor wafer is, at its first main surface, being mechanically coupled to a handling wafer, the thinning is carried out and the function-providing semiconductor wafer is divided in its state coupled to the handling wafer, and during or after connecting the semiconductor element to the lead frame the mechanical coupling between the semiconductor element and the corresponding part of the handling wafer is released or destroyed.

In a further embodiment, for providing the coupling between the semiconductor wafer and the handling wafer an adhesive is applied to basically the whole surface of the function-providing semiconductor wafer, to form an adhesive layer. Thereafter, the adhesive layer is patterned such that plural anchor islands are formed from the adhesive layer on each of the semiconductor elements. Specifically, in this process the function-providing semiconductor wafer and the handling wafer are coupled by means of contacting the handling wafer with the anchor islands on the semiconductor wafer at a softening temperature of the adhesive.

In a further embodiment, the coupling between the function-providing semiconductor wafer and the handling wafer is provided by forming an adhesive layer from a thermally releasable or destroyable or thermally softening adhesive, in particular a polyimida adhesive, between both wafers, and the coupling is released or destroyed by heating the adhesive layer above a temperature at which the adhesive degenerates or softens.

In some embodiments, the step of mechanically and electrically connecting the semiconductor element to the lead frame may comprise using a solder material capable of forming intermetallic phases by isothermal solidification or using a thermal curing, electrically conductive adhesive and essentially at the same time when the coupling between the semiconductor element and the corresponding part of the handling wafer is destroyed, by heating the semiconductor element and the handling wafer to a hardening temperature of the solder or a curing temperature of the conductive adhesive. Herein, an AuSn or InSn based solder material may be used.

Alternatively, in some embodiments the mechanical and electrical connection of the semiconductor element to the lead frame may employ a thermally curing, electrically conductive adhesive on epoxy rather than a solder material.

Furthermore, in some embodiments. connecting the semiconductor element to the lead frame a heating of the semiconductor element and/or the lead frame may be carried out by means of a hot plate and/or a heated bond tool.

In a further embodiment, the coupling between the function-providing semiconductor wafer and the handling wafer is made by forming an adhesive layer between both wafers, using an adhesive which is soluble in a solvent which does not affect the semiconductor wafer. Herein, the adhesive layer is destroyed or released in a bath of said solvent, after the semiconductor element has been connected to the lead frame.

In the embodiments mentioned above, and in further embodiments, in the step of releasing or destroying the coupling between the semiconductor element and the corresponding part of the handling wafer a mechanical force is applied to effect or assist the releasing. In particular, a pull or shear force is applied to an adhesive layer between the semiconductor element and the corresponding part of the handling wafer. In some embodiments, for further assisting this force, the semiconductor element and the corresponding part of the handling wafer, in the coupled state thereof, are subjected to an ultrasonic wave treatment.

Furthermore, some embodiments of the invention include mechanical coupling between the semiconductor element and the corresponding part of the handling wafer which is destroyed after the semiconductor element and the lead frame came into contact with each other. Specifically, the corresponding part of the handling wafer is pulled away from the semiconductor element as soon as a bonding force between the latter and the lead frame has become strong enough to secure the wafer to the lead frame and allow release of the handling wafer from the semiconductor element. More specifically, the coupling between the semiconductor element and the corresponding part of the handling wafer is destroyed by applying a force the value of which is above the bonding force between semiconductor element and handling wafer but below the bonding force between semiconductor element and lead frame, at the moment of applying the destroying force.

In any of the embodiments above, and in further embodiments, the thinning of the function-providing semiconductor wafer to a predetermined thickness comprises grinding the function-providing semiconductor wafer at its free surface. More specifically, subsequent to the grinding step a selective etching step is carried out which etching step inherently stops at a buried oxide layer within the function-providing semiconductor wafer. Furthermore, the thinning may comprise a Chemical-Mechanical Polishing (CMP).

CONCLUSION

Some embodiments processes for manufacturing SOI type semiconductor elements include a wafer-bonding step of bonding a semiconductor wafer, after steps of forming an insulation layer thereon and an in-depth weakened layer therein, to a handling wafer and a subsequent step of providing a cleavage within the initial wafer, at the mean ion penetration depth thereof. In the result of these steps, a thin layer of the function-providing wafer adheres to the handling wafer, i.e. the split-off layer basically replaces a epitaxial layer of conventional SOI structures. The remaining (much thicker) portion of the initial wafer may be subject of recycling and re-introduced into the manufacturing process as a function-providing or handling wafer, respectively.

A further process of providing semiconductor elements of the vertical type with low on-resistance is based on the process of epitaxially depositing a thin semiconductor (silicon) layer on an insulating substrate, the substrate providing for the necessary mechanical stability. This process is known as SOI (silicon-on-insulator) technology. SOI wafers, also known as "engineered" wafers, consist of multiple layers of substrate materials. Advanced engineered wafers use layering, implantation and/or bonding of advanced substrate materials into and onto a silicon wafer or other substrate, resulting in the replacement of a conventional bulk wafer by a stack of substrate layers, which are determining the semiconductor element functions, on some kind of "handling" wafer. The handling wafer may consist of quartz (SOQ-technology) or fused silica etc.

Major applications of semiconductor elements of the SOI or SOQ or similar types are low voltage applications for portable electronic or communication devices, high speed applications in GHz processors of fast memories, high voltage applications (automotive, TV-sets, switches), smart sensors (automotive) or LCDs but the number of applications is steadily increasing.

The invention claimed is:

1. A process of manufacturing a semiconductor element on a semiconductor wafer, comprising:
   providing a plurality of semiconductor elements on an upper surface of a wafer having a predetermined thickness;
   mechanically coupling the upper surface of the wafer to a handling wafer;
   thinning the wafer;
   connecting a lower surface of the wafer to a lead frame; and
   removing the mechanical coupling between the wafer and the handling wafer while the wafer remains connected to the lead frame.

2. The process according to claim 1, wherein the coupling between the wafer and the handling wafer is provided by forming an adhesive layer of a polyamide adhesive between both wafers and wherein the coupling is removed by heating the adhesive layer above a temperature at which the adhesive softens.

3. The process according to claim 2, wherein connecting the wafer to the lead frame is carried out using a solder material and wherein the connecting of the lower surface of the wafer to the lead frame and the removing of the coupling between the wafer and the handling wafer occurs at essentially the same time.

4. The process according to claim 3, wherein a solder material is one or more materials selected from AuSn and or InSn or alloys thereof.

5. The process according to claim 2, wherein connecting the wafer to the leadframe is carried out using a thermally curing, electrically conductive epoxy adhesive.

6. The process according to claim 2, wherein connecting the wafer to the lead frame includes heating of at least one of the wafer and the lead frame by a heated tool.

7. The process according to claim 1, wherein the coupling between the wafer and the handling wafer is made by forming an adhesive layer between both wafers using an adhesive which is soluble in a solvent which does not affect the wafer, and wherein the adhesive layer is destroyed in a bath of said solvent, after the semiconductor element has been connected to the lead frame.

8. The process according to claim 1, wherein removing the coupling between the wafer and the handling wafer includes applying a mechanical force assist in removing the coupling.

9. The process according to claim 8, wherein removing the coupling between the wafer and the handling wafer includes applying a pull or shear force to an adhesive layer between the wafer and the handling wafer.

10. The process according to claim 8, wherein removing the coupling between the wafer and handling wafer includes treating the coupling with an ultrasonic wave.

11. The process according to claim 1, wherein mechanically coupling the wafer and the handling wafer includes applying an adhesive is applied to basically the whole surface of the wafer, to form an adhesive layer, and thereafter patterning the adhesive layer to form plural anchor islands on each of the semiconductor elements.

12. The process according to claim 11, wherein mechanically coupling the wafer and the handling wafer includes heating the anchor islands on the wafer at a softening temperature of the adhesive.

13. The process according to claim 1, wherein providing wafer, comprises providing an SOI wafer.

14. The process according to claim 1, wherein the semiconductor elements are one or more a power semiconductor elements selected from MOSFET semiconductor or an IGBT type semiconductor.

15. The process according to claim 1, wherein the semiconductor element is an integrated circuit.

16. The process according to claim 1 wherein removing the mechanical coupling between the wafer and the handling wafer occurs after the connecting of the lower surface of the wafer to the lead frame.

17. The process according to claim 1 wherein removing the mechanical coupling between the wafer and the handling wafer occurs by heating the thermally destroyable or thermally softening adhesive above a temperature at which the adhesive degenerates or softens.

18. The process according to claim 1 wherein removing the mechanical coupling between the wafer and the handling wafer occurs by heating at least one of the wafer and the lead frame to a hardening temperature of the solder or a curing temperature of the conductive adhesive.

19. The process according to claim 1 wherein removing the mechanical coupling between the wafer and the handling wafer occurs using a bath of the solvent which is suitable to dissolve the adhesive but does not affect the semiconductor element.

20. The process according to claim 1 wherein removing the mechanical coupling between the wafer and the handling wafer occurs using a bath of the solvent which is suitable to dissolve the adhesive but does not affect the semiconductor wafer, and wherein a mechanical force is applied to the coupling between the wafer and the handling wafer, to assist the destroying of the coupling between both of them.

21. The process according to claim 1, wherein providing the wafer having a predetermined thickness includes grinding the function-providing semiconductor wafer at its lower surface.

22. The process according to claim 21, wherein subsequent to the grinding, a selective etching step is carried out which etching step inherently stops at a buried oxide layer within the wafer.

23. The process according to claim 17, wherein thinning of the wafer to a predetermined thickness comprises grinding the function-providing semiconductor wafer at its lower surface.

24. A process for producing a thin semiconductor element, comprising:
   providing a function-providing semiconductor wafer;
   forming a plurality of semiconductor elements in a first main surface of the function-providing semiconductor wafer;
   mechanically coupling the function-providing semiconductor wafer at the first main surface thereof to a handling wafer;
   thinning the function-providing semiconductor wafer to a predetermined thickness, in its state mechanically coupled to the handling wafer, to provide a second main surface of the function-providing semiconductor wafer;

carrying out predetermined processing steps at the second main surface of the function-providing semiconductor wafer;

dividing the function-providing semiconductor wafer, in its state coupled to the handling-wafer, into separated semiconductor elements, each of the separated semiconductor elements being coupled to a corresponding part of the handling wafer; and mechanically and electrically connecting at least one of the separated semiconductor elements to a lead frame, at the same time destroying the mechanical coupling between the at least one separated semiconductor element and the corresponding part of the handling wafer.

25. The process according to claim 24, wherein the coupling between the function-providing semiconductor wafer and the handling wafer is provided by forming an adhesive layer from a thermally destroyable or thermally softening adhesive, in particular an adhesive of polyimide basis, between both wafers and wherein the coupling is destroyed by heating the adhesive layer above a temperature at which the adhesive degenerates or softens.

26. The process according to claim 25, wherein mechanically and electrically connecting the at least one separated semiconductor element to the lead frame is carried out using a solder material capable of forming intermetallic phases by isothermal solidification or a thermally curing, electrically conductive adhesive and essentially at the same time when the coupling between the at least one separated semiconductor element and the corresponding part of the handling wafer is destroyed by heating the semiconductor element separated semiconductor element and the handling wafer to a hardening temperature of the solder or a curing temperature of the conductive adhesive.

27. The process according to claim 25, wherein the heating of the at least one separated semiconductor element and the handling wafer is carried out by means of a hot plate and/or a heated bond tool for connecting the separated semiconductor elements to the lead frame.

28. The process according to claim 24, wherein the coupling between the function-providing semiconductor wafer and the handling wafer is made by forming an adhesive layer between both wafers, using an adhesive which is soluble in a solvent which does not affect the function-providing semiconductor wafer, and wherein the adhesive layer is destroyed in a bath of said solvent, after the at least one separated semiconductor element has been connected to the lead frame.

29. The process according to claim 24, wherein in destroying the coupling between the at least one separated semiconductor element and the corresponding part of the handling wafer a mechanical force is applied to assist the destroying.

30. The process according to claim 24, wherein for providing the coupling between the function-providing semiconductor wafer and the handling wafer an adhesive is applied to basically the whole surface of the function-providing semiconductor wafer, to form an adhesive layer, and thereafter the adhesive layer is patterned such that plural anchor islands are formed from the adhesive layer on each of the plurality of semiconductor elements.

31. The process according to claim 30, wherein the function-providing semiconductor wafer and the handling wafer are coupled by means of contacting the handling wafer with the anchor islands on the function-providing semiconductor wafer at a softening temperature of the adhesive.

32. The process according to claim 24, wherein providing a function-providing semiconductor wafer comprises providing an SQL wafer including a buried oxide layer.

33. The process according to claim 32, wherein thinning the function-providing semiconductor layer comprises a selective etching starting from the free surface thereof, in its state coupled to the handling wafer, and stopping at the exposed surface of the buried oxide layer.

* * * * *

UNITED STATES PATENT AND TRADEMARK OFFICE
CERTIFICATE OF CORRECTION

PATENT NO. : 7,655,527 B2  
APPLICATION NO. : 11/557387  
DATED : February 2, 2010  
INVENTOR(S) : Hans-Hinnerk Steckhan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 494 days.

Signed and Sealed this

Twenty-eighth Day of December, 2010

David J. Kappos  
*Director of the United States Patent and Trademark Office*